(12) United States Patent
Chen et al.

(10) Patent No.: US 9,589,078 B2
(45) Date of Patent: Mar. 7, 2017

(54) CONSTRUCTING THREE DIMENSIONAL MODEL USING USER EQUIPMENT

(71) Applicant: Futurewei Technologies, Inc., Plano, TX (US)

(72) Inventors: Yunxia Chen, Fremont, CA (US); Sheng Xu, Fremont, CA (US)

(73) Assignee: Futurewei Technologies, Inc., Plano, TX (US)

( * ) Notice: Subject to any disclaimer, the term of this patent is extended or adjusted under 35 U.S.C. 154(b) by 1044 days.

(21) Appl. No.: 13/729,695

(22) Filed: Dec. 28, 2012

(65) Prior Publication Data

US 2014/0088928 A1    Mar. 27, 2014

Related U.S. Application Data

(60) Provisional application No. 61/706,525, filed on Sep. 24, 2012.

(51) Int. Cl.
| | |
|---|---|
| *G06F 17/50* | (2006.01) |
| *G06T 17/00* | (2006.01) |
| *G01C 11/02* | (2006.01) |
| *G06F 17/30* | (2006.01) |
| *G01B 11/02* | (2006.01) |

(52) U.S. Cl.
CPC .......... *G06F 17/5004* (2013.01); *G06T 17/00* (2013.01); *G01B 11/02* (2013.01); *G01C 11/02* (2013.01); *G06F 17/30241* (2013.01); *G06T 2207/10028* (2013.01); *G06T 2210/04* (2013.01)

(58) Field of Classification Search
None
See application file for complete search history.

(56) References Cited

U.S. PATENT DOCUMENTS

| | | | | |
|---|---|---|---|---|
| 7,050,102 B1 * | 5/2006 | Vincent | ................ | G01C 11/02 348/141 |
| 7,545,956 B2 * | 6/2009 | Miyahara | ................ | G01S 11/12 340/435 |
| 7,583,275 B2 * | 9/2009 | Neumann | ................ | G06T 17/00 345/419 |
| 8,306,747 B1 * | 11/2012 | Gagarin | ................ | G01C 7/04 701/408 |

(Continued)

OTHER PUBLICATIONS

Belimpasakis, Petros, Petri Selonen, and Yu You. "A web service platform for building interoperable augmented reality solutions." in International AR standards Workshop Oct. 11-12, 2010, pp. 1-5. 2010.*

*Primary Examiner* — Aniss Chad
*Assistant Examiner* — David M Rogers
(74) *Attorney, Agent, or Firm* — Conley Rose, P.C.

(57) ABSTRACT

A user equipment (UE) comprising a display, a visual input configured to capture motion or stop photography as visual data, a memory comprising instructions, and a processor coupled to the display, the input device, and the memory and configured to execute the instructions by receiving visual data from the visual input, determining a position of the feature relative to the UE if the visual data comprises a feature of a first area of a location, and generating a model of the first area of the location based on the position of the feature. The disclosure also includes a method comprising receiving data indicating a position of a feature of a location relative to a UE, and generating a model of the location based on the position of the feature.

19 Claims, 5 Drawing Sheets

(56) References Cited

U.S. PATENT DOCUMENTS

| | | | | |
|---|---|---|---|---|
| RE44,925 E * | 6/2014 | Vincent | G01C 11/02 348/141 |
| 8,818,016 B2 * | 8/2014 | Choi | G06K 9/00664 382/100 |
| 2003/0103651 A1 * | 6/2003 | Novak | G01C 11/02 382/106 |
| 2004/0109012 A1 * | 6/2004 | Kraus | G01C 15/00 715/700 |
| 2006/0017812 A1 * | 1/2006 | Kogane | G08B 13/1963 348/207.11 |
| 2006/0182313 A1 * | 8/2006 | Miyahara | G01C 3/22 382/104 |
| 2006/0215881 A1 * | 9/2006 | Nakajima | G01B 11/024 382/106 |
| 2008/0015777 A1 * | 1/2008 | Heimberger | G01S 13/86 701/301 |
| 2008/0166017 A1 * | 7/2008 | Ito | G06K 9/00369 382/103 |
| 2008/0170755 A1 * | 7/2008 | Nasser | G06Q 30/02 382/106 |
| 2008/0319655 A1 * | 12/2008 | Vande Velde | G01C 21/32 701/532 |
| 2010/0277504 A1 | 11/2010 | Song | |
| 2011/0064312 A1 * | 3/2011 | Janky | G01C 15/00 382/195 |
| 2011/0134108 A1 | 6/2011 | Hertenstein | |
| 2011/0217962 A1 | 9/2011 | Leung | |
| 2011/0238751 A1 | 9/2011 | Belimpasakis et al. | |
| 2011/0279445 A1 * | 11/2011 | Murphy | G06F 3/04842 345/419 |
| 2013/0163879 A1 * | 6/2013 | Katz | G06T 7/0044 382/195 |
| 2013/0321398 A1 * | 12/2013 | Howard | G06T 19/00 345/419 |

\* cited by examiner

CONSTRUCTING THREE DIMENSIONAL MODEL USING USER EQUIPMENT

CROSS-REFERENCE TO RELATED APPLICATIONS

The present application claims priority to U.S. Provisional Patent Application No. 61/706,525 filed Sep. 27, 2012 by Yunxia Chen, et al. and entitled "Constructing Three Dimensional Building Model Using User Equipment," which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

In order to perform layout planning of a location, such as a building, it may be advantageous to create a three dimensional (3D) model of the location. Viewing the 3D model may grant the planner a perspective of the location that would otherwise be unavailable. For example, by using a 3D model the planner may efficiently position system components based on the physical limitations of the location. In order to create a 3D model, a user may be required to take various measurements of a location and employ complicated and expensive software to draw the location, which may be time consuming and may require substantial expertise and/or training on the part of the user.

SUMMARY

In one embodiment, the disclosure includes a user equipment (UE) comprising a display, a visual input configured to capture motion or stop photography as visual data, a memory comprising instructions, and a processor coupled to the display, the input device, and the memory and configured to execute the instructions by receiving visual data from the visual input, determining a position of the feature relative to the UE if the visual data comprises a feature of a first area of a location, and generating a model of the first area of the location based on the position of the feature.

In another embodiment, the disclosure includes a method comprising receiving data indicating a position of a feature of a location relative to a UE, and generating a model of the location based on the position of the feature.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is a UE comprising a visual input (e.g. a camera) and a display that may be employed to generate a 3D model of a location, such as a building. A user may enter an area of a location (e.g. a room of a building) and position the UE at a known height (e.g. a height above the floor). The location may comprise various features, for example corners between walls, floors, ceilings, etc. The user may pan, rotate, or otherwise move the facing of the UE visual input around the room to point at location features while maintaining a relatively constant UE height and position. The UE may display visual data captured by the visual input on the display. The user may indicate to the UE when a location feature is positioned in a predetermined portion of the display. The UE may determine the physical positions of each feature relative to the user based on user input (e.g. using trigonometry) and create a 3D model of the area of the location. The user may then repeat the process in other areas of the location and combine the 3D models of the areas to create a 3D model of the location.

Figure 1:
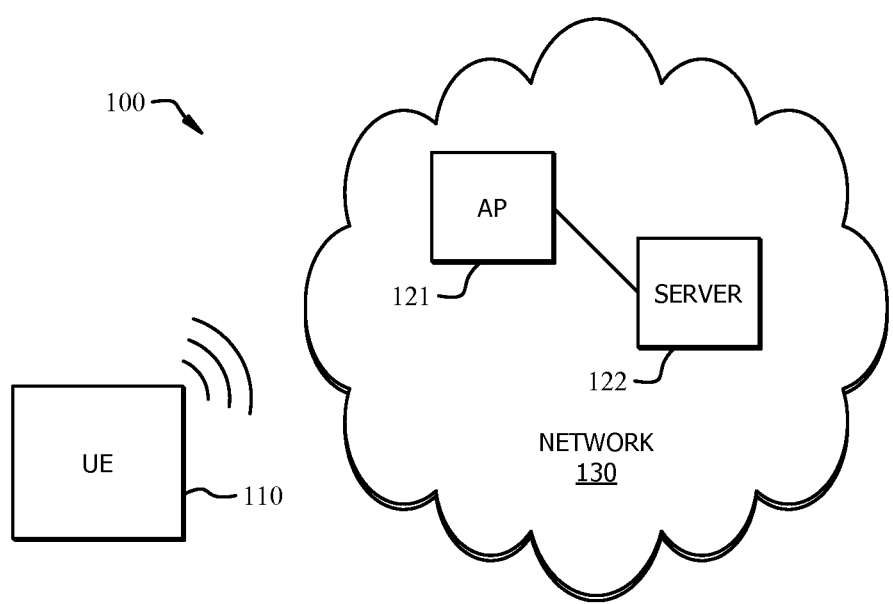
FIG. 1 is a schematic diagram of a network architecture for supporting 3D model creation by a UE.

FIG. 1 is a schematic diagram of a network architecture 100 for supporting 3D model creation by a UE 110. The network 130 may comprise a server 122 connected to the UE 110 via an access point (AP) 121. The UE 110 may connect to AP 121 via a wired or wireless (e.g. NE 130) communication.

UE 110 may comprise a hand-held wireless or wired device comprising a visual input (e.g. a camera), a display, position sensors, and/or other inputs. A user may employ the UE 110 to generate a 3D model of a location. A location may be any physical area with designated boundaries, such as a building, a structure, a geographical area, etc. An area may be any subportion of a location, such as a room of a building. A user may point the visual input at an object or structure such as a wall, a ceiling, etc., and the UE 110 may display any recorded visual data to the user. The UE may overlay a graphical item on the visual data. The user may align features of the area/location with the graphical item(s). Based on the alignment, the UE 110 may generate a model of the location.

UE 110 may generate and/or save any generated model locally. The UE 110 may also receive and/or transmit models and/or related data from/to server 122 via access point 121. For example, the UE 110 may generate models based on user input and transmit the models to server 122 for storage. As another example, the server 122 may generate models based on data received from the UE 110 such as user input and/or data indicating the positions of features relative to the UE 110, Global Positioning System (GPS) data, etc.

Figure 2:
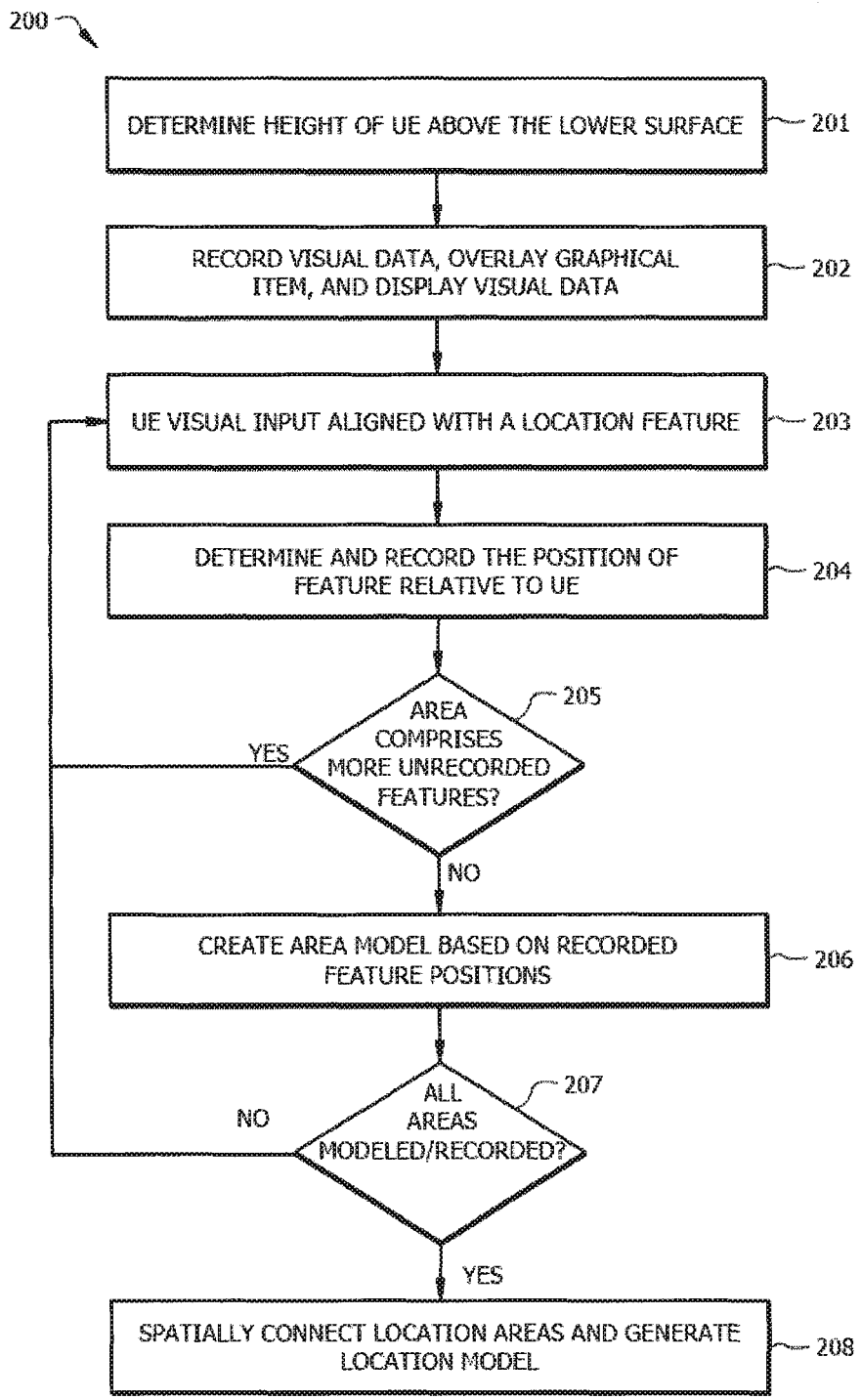
FIG. 2 is a flowchart of an embodiment of a method of creating a 3D model of a location with a UE.

FIG. 2 is a flowchart of an embodiment of a method 200 of creating a 3D model of a location with a UE, such as UE 110. A user may position a UE in an area of location, such as a room of a building. The user may hold the UE at a height above a lower surface of area (e.g. the floor). At block 201, the method 200 may determine the height of the UE above the lower surface. The height may be determined by receiving the height from the user via a UE input device. In addition or in the alternative, the UE may employ position sensors to determine the height of the UE at a specified time, for example based on triangulation of wireless signals. Once the height of the UE is determined, the method may proceed to block 202. At block 202, the method 200 may record visual data (e.g. via a UE visual input) and overlay a graphical item, such as a target, on visual data. The method 200 may then display the visual data (e.g. via a UE display) comprising the graphical item to the user.

At block 203, the UE visual input may be aligned with a location feature (e.g. the corner of a wall). For example, the user may move the UE in order to align the graphical item and the location feature on the display. The user may rotate the UE in three dimensions around the UE's latitudinal, longitudinal, and/or vertical axis. The user may maintain the UE at approximately the same height and position in the location. The user may hold the UE at the user's eye level and pivot to pan the UE around the room and/or tilt the UE to align the visual input with the feature. As another example, the user may indicate to the UE that alignment is complete via an input device. After the UE visual input is aligned with a location feature, method 200 may proceed to block 204.

At block 204, the method 200 may determine and record the position of the aligned feature relative to the UE. The determination may be made using trigonometric calculations based on height (e.g. as input by the user) and angles determined by UE position sensors. The method 200 may then proceed to block 205 and determine if the area comprises more unrecorded features. The method 200 may determine if the area comprises more unrecorded features, for example via user input and/or by comparing an expected number of features (e.g. stored in memory) with a number of recorded features. For example, a room may comprise a minimum of four corners where two walls and a ceiling intersect and four corners where two walls and a floor intersect. If less than eight features (e.g. corners) have been recorded, the method 200 may determine that not all features have been recorded. The method 200 may proceed to block 202 if unrecorded features remain and block 206 if all features of the area have been recorded. At block 206, the method 200 may create an area model based on the recorded feature positions from block 204 and proceed to block 207. For example, method 200 may model the area by generating model surfaces (e.g. walls, floors, ceilings, etc.) that extend between feature positions.

At block 207, the method 200 may determine whether all areas of the location have been modeled and/or recorded (e.g. via user input). The method 200 may proceed to block 208 if all areas have been modeled and/or recorded and return to block 202 if not all areas have been modeled and/or recorded. At block 208, the method 200 may spatially connect the area models and generate a location model. For example, the area models may be connected based on user input (e.g. via UE input) that indicates how the areas should be connected. In addition or in the alternative, the UE may record position data for each area at block 204 using the position sensors (e.g. GPS data, etc.) The method 200 may then connect the areas based on the position data associated with each area.

It should be noted that method 200 may be implemented on a UE or on a server, such as server 122 based on data received from a UE, or combinations thereof. For example, the UE may be used by the user to determine feature positions, and the server may generate any models resulting therefrom. It should also be noted that a known height as determine in block 201 may be used to determine the actual size of the modeled location based on the feature positions. Block 201 may omitted if a determination of the actual size of the modeled location is unnecessary for a given application. Also, block 201 may be omitted if some other dimension of the location is known.

Figure 3:
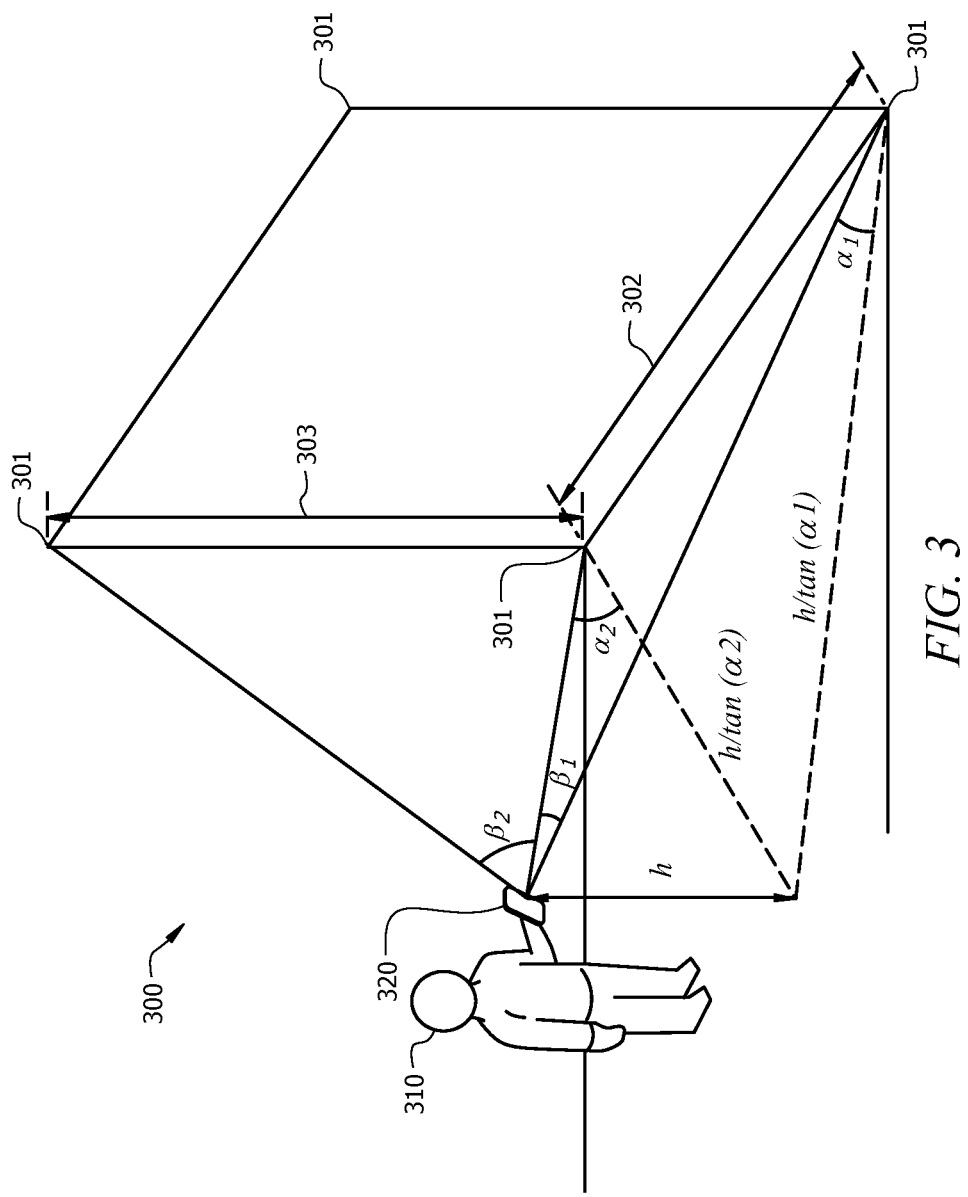
FIG. 3 is a diagram of an embodiment of a method of determining positions of features of an area relative to a UE.

FIG. 3 is a diagram 300 of an embodiment of a method of determining positions of features 301 of an area relative to a UE 320, for example as implemented in blocks 201-204 of method 200. As discussed above, an area may be a room in a building. Each area of a location may comprise elements such as walls, ceilings, floors, etc. Such elements may intersect (e.g. at corners) creating features 301 that may be used to model the area. A user 310 may move the UE 320 into a position in the area. The UE 320 may be substantially similar to UE 110. The user 310 may hold the UE 320 at a relatively constant height (h) and indicate the height to the UE 320. In addition or in the alternative, the UE 320 may determine current height based on data from UE position sensors. As an example, the user 310 may hold the UE 320 at the user's 310 eye level, shoulder level, etc. As another example, the user 310 may mount the UE 320 to an object/device, such as a tripod and/or a pole, to reduce height fluctuations during use. The user 310 may point a visual input of the UE 320 at a feature 301. The UE 320 may display both visual data captured by the visual input and a graphical item for use in UE 320 alignment. The user 310 may indicate to the UE 320 when a feature 301 is aligned with the graphical item in the display. In addition or in the alternative, the UE 320 may employ pattern recognition procedures to determine when the feature is aligned with a predetermined portion of the UE 320 visual input.

As shown in FIG. 3, the position of a feature 301 relative to the UE 320 may be a function of height and a first angle $\alpha 1$ and may be expressed by the equation $D=h/\tan(\alpha 1)$, where D is the lateral distance between the UE 320 and the feature 301 and $\alpha 1$ is vertical angle between a line extending from the center of the UE 320 to the feature 301 and line between the UE 320 and the feature 301 in the lateral plane. The value of $\alpha 1$ may be determined based on data from the position sensors (e.g. data from a gyroscope, accelerometer, etc.) indicating the vertical facing of the UE 320 when the UE 320 is aligned with the feature 301. The distance D between the position of the UE 320 and the feature 301 may be saved by the UE 320.

The UE 320 may also determine the position of the features 301 relative to the UE 320 based on the data from the position sensors. For example, the UE position sensors may comprise a magnetometer that indicates geographic facing of the UE 320 at a specified time. The UE position sensors may comprise a gyroscope or an accelerometer that indicates the vertical facing of the UE 320 at a specified time. The facing of the UE 320 at a given time and the distance D to a feature 301, as determined based on the vertical facing of the UE, may be used to position the feature 301 on a 3D model. The UE 320 may perform a similar calculation to determine the distance to a second feature 301 using the equation $D=h/\tan(\alpha 2)$ wherein $\alpha 2$ is a vertical angle between a line extending from the center of the UE 320 to the second feature 301 and line between the UE 320 and the second feature 301 in the lateral plane. Using the distances and measured facings, the UE 320 may determine the positions of each feature relative to the UE 320, create a 3D model of the area on the UE 320 display, and aggregate the area models to create a 3D model of the location.

An object with features 301 may comprise a length 302 and a height 303. The UE 320 may determine the length 302 and height 303 of the object based on the known height of the UE 302 h and angles β1 and/or β2 as shown in FIG. 3. For example, length 302 may be calculated using the equation:

$$\text{Length } 302 = \left(\frac{h}{\sin(\alpha 1)}\right)^2 + \left(\frac{h}{\sin(\alpha 2)}\right)^2 - 2\frac{h^2\cos(\beta 1)}{\sin(\alpha 1)\sin(\alpha 2)}$$

As another example, height 303 (H) may be calculated by the equation:

$$\text{Height } 303 = h + h\frac{\tan(\beta 2 - \alpha 2)}{\tan(\alpha 2)}$$

Angles β1 and/or β2 may be determined using data from UE 320 position sensors in a similar manner to angles α1 and α2 (e.g. data from a gyroscope, accelerometer, etc.)

In addition and/or in the alternative, other trigonometric principles may be used to determine the positions of features 301 relative to a UE 320 using data from the position sensors. For example, the data from a magnetometer indicating changes in facing may be used to determine horizontal angles between features 301. As another example, features 301 may comprise corners or other features of a curved wall. Once the positions of the features 301 relative to the UE 320 are measured, appropriate best fit modeling algorithms may be applied to generate a model of a curved wall passing through the feature 301 positions, which may then be added to the model of the area/location. Also, the equations discussed herein are expressed in terms of UE 320 height above a lower surface. However, such equations may be expressed based on other known constants such as the height, width, and/or length of a feature of the location in the event that the height of the UE is unknown. For example, the known height of a building may be used to determine the scale of a model resulting from methods 200 and/or 300.

Figure 4:
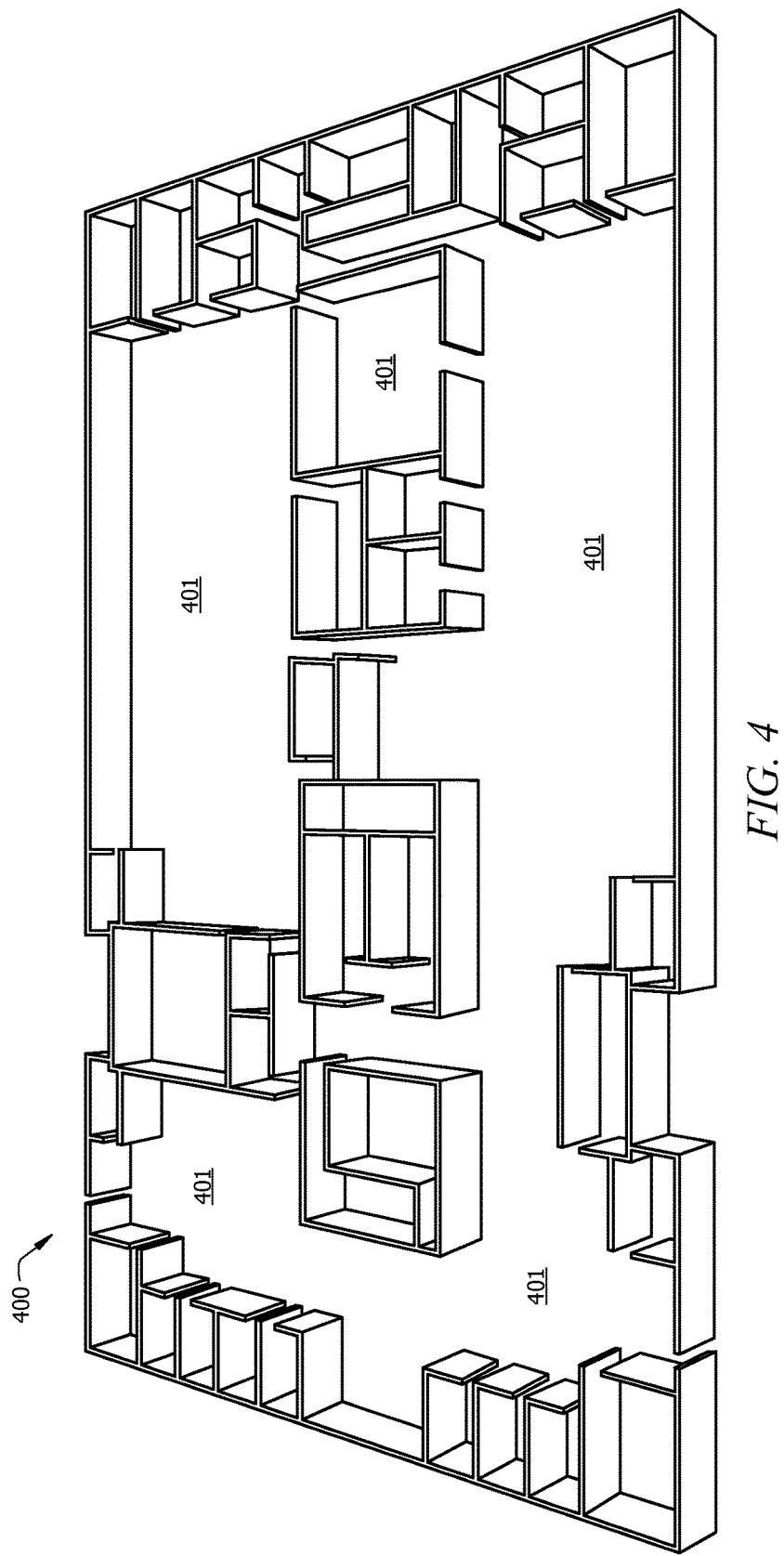
FIG. 4 is an example of a 3D model of a location.

FIG. 4 is an embodiment of a 3D model 400 of a location, such as an interior layout of a floor of a building. For example, the model 400 may comprise a plurality of 3D models 401 of areas in a location, which may be created at blocks 201-206 of method 200. 3D model 400 may be created at block 208 by connecting 3D models 401. The area models 401 may be separated by walls, floors, ceilings, etc. 3D model 400 depicts a single floor of a building for purposes of clarity. However, it should be noted that a model of a multi-story building may be generated, for example at block 208, by connecting models of location areas, such as models 401, and/or models of floors, such as model 400, as needed in 3D space. The data defining model 400 may be saved in a plurality of available industry standard formats (e.g. portable document format (PDF), drawing (DWG), etc.) for use by a broad variety of readily available programs.

Figure 5:
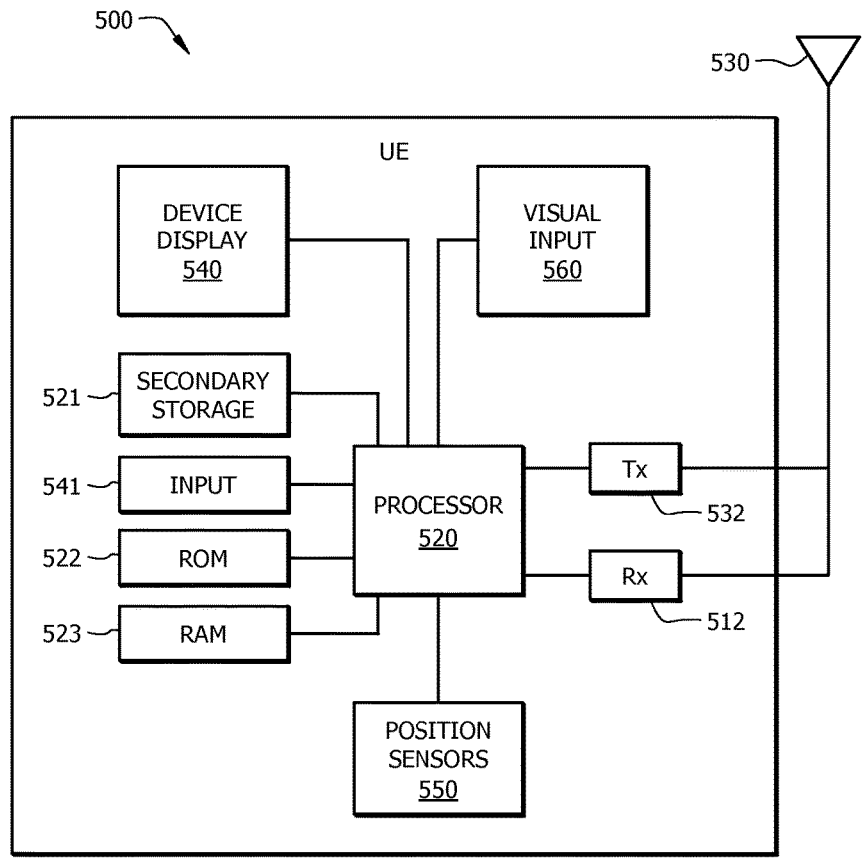
FIG. 5 is a schematic diagram of an embodiment of a UE.

FIG. 5 is a schematic diagram of an embodiment of a UE 500, which may be employed in method 200, method 300, may implement UE 110, and/or UE 320. UE 500 may comprise a two-way wireless communication device having voice and/or data communication capabilities. In some aspects, voice communication capabilities are optional. The UE 500 generally has the capability to communicate with other computer systems on the Internet and/or other networks. Depending on the exact functionality provided, the UE 500 may be referred to as a data messaging device, a tablet computer, a two-way pager, a wireless e-mail device, a cellular telephone with data messaging capabilities, a wireless Internet appliance, a wireless device, a smart phone, a mobile device, or a data communication device, as examples.

UE 500 may comprise a processor 520 (which may be referred to as a central processor unit or CPU) that may be in communication with memory devices including secondary storage 521, read only memory (ROM) 522, and random access memory (RAM) 523. The processor 520 may be implemented as one or more general-purpose CPU chips, one or more cores (e.g., a multi-core processor), or may be part of one or more application specific integrated circuits (ASICs) and/or digital signal processors (DSPs). The processor 520 may be configured to implement any of the schemes described herein, and may be implemented using hardware, software, firmware, or combinations thereof.

The secondary storage 521 may be comprised of one or more solid state drives and/or disk drives which may be used for non-volatile storage of data and as an over-flow data storage device if RAM 523 is not large enough to hold all working data. Secondary storage 521 may be used to store programs that are loaded into RAM 523 when such programs are selected for execution. The ROM 522 may be used to store instructions and perhaps data that are read during program execution. ROM 522 may be a non-volatile memory device may have a small memory capacity relative to the larger memory capacity of secondary storage 521. The RAM 523 may be used to store volatile data and perhaps to store instructions. Access to both ROM 522 and RAM 523 may be faster than to secondary storage 521.

UE 500 may be any device that communicates data (e.g., packets) wirelessly with a network. The UE 500 may comprise a receiver (Rx) 512, which may be configured for receiving data, packets, or frames from other components. The receiver 512 may be coupled to the processor 520, which may be configured to process the data and determine to which components the data is to be sent. The UE 500 may also comprise a transmitter (Tx) 532 coupled to the processor 520 and configured for transmitting data, packets, or frames to other components. The receiver 512 and transmitter 532 may be coupled to an antenna 530, which may be configured to receive and transmit wireless (radio) signals.

The UE 500 may also comprise a device display 540 coupled to the processor 520, for displaying output thereof to a user. The device display 520 may comprise a light-emitting diode (LED) display, a Color Super Twisted Nematic (CSTN) display, a thin film transistor (TFT) display, a thin film diode (TFD) display, an organic LED (OLED) display, an active-matrix OLED display, or any other display screen. The device display 540 may display in color or monochrome and may be equipped with a touch sensor based on resistive and/or capacitive technologies.

The UE 500 may further comprise input devices 541 coupled to the processor 520, which may allow the user to input commands to the UE 500. In the case that the display device 540 comprises a touch sensor, the display device 540 may also be considered an input device 541. In addition to and/or in the alternative, an input device 541 may comprise a mouse, trackball, built-in keyboard, external keyboard, and/or any other device that a user may employ to interact with the UE 500.

The UE may further comprise a visual input 560 configured to capture motion or stop photography in the visual input's 560 field of view as visual data. For example, the visual input 560 may comprise a video camera or still camera. The visual input's 560 field of view may be the extent of the observable world that may be observed by the visual input 560 at a given time. The visual input's 560 field of view may be described in terms of the UE's 500 physical position, horizontal facing, vertical facing, and/or height (e.g. above the Earth's surface, above sea level, etc.) at a given time. A physical position may be the position of a component with respect to the Earth's surface at a specified point in time (e.g. geographic position). The visual input's 560 field of view may be further described in terms of an angular field of view associated with a specific implementation of the visual input, such as the angular field of view associated with a particular camera and/or lens. The visual input 560 may be coupled to the processor 520, and may forward visual data captured in the visual input's field of view to the processor for processing, storage, transmission, and/or display. For example, a user may align the visual input with a location feature at block 203 of method 200 by moving the UE 500 until visual data captured by the visual input 560 comprises a feature displayed on the display device 540 in the same location as a graphical item created by the processor 520 and displayed on the display device for that purpose.

The UE 500 may further comprise position sensors 550. Position sensors 550 may be coupled to the processor and may be configured to determine the physical location, height, vertical facing and/or horizontal facing of the UE 500 and/or of the visual input 560 (e.g. field of view data) at a given time. Position sensors 550 may comprise global position system (GPS) sensors, magnetometers, accelerometers, gyroscopes, and/or other sensors. Position sensors 550 may transmit collected field of view data to the processor 520 for determination of the visual input's 560 field of view at a specified time. The position sensors 550 may also measure geographical movement, angular rotation (e.g. pitch, yaw, and roll), and/or changes in geographical facing (e.g. north, east, south, etc.) as field of view data, which may be used to determine the position of features relative to the UE 500 as discussed above.

Figure 6:
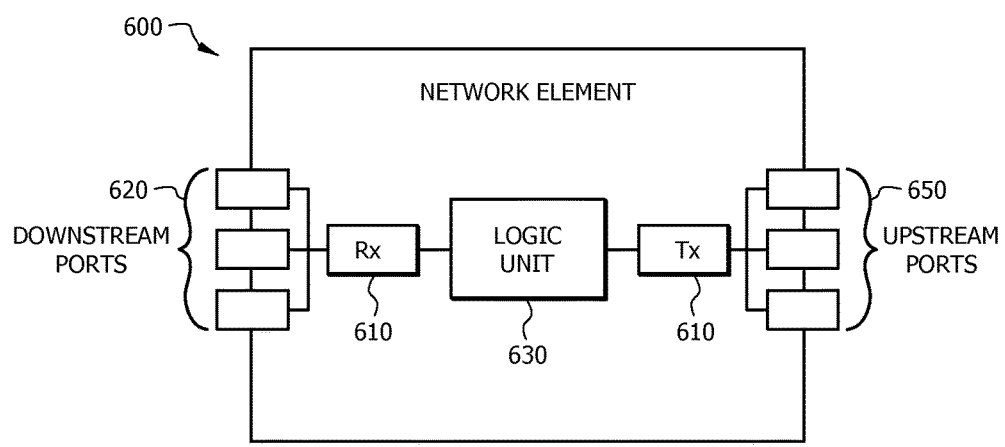
FIG. 6 is a schematic diagram of an embodiment of a NE.

FIG. 6 is a schematic diagram of an embodiment of a NE 600, which may function as a node in a network, such as AP 121 and/or server 122 in network 130. One skilled in the art will recognize that the term NE encompasses a broad range of devices of which NE 600 is merely an example. NE 600 is included for purposes of clarity of discussion, but is in no way meant to limit the application of the present disclosure to a particular NE embodiment or class of NE embodiments. At least some of the features/methods described in the disclosure, for example methods 200 and/or 300, may be implemented in a network apparatus or component such as an NE 600. For instance, the features/methods in the disclosure may be implemented using hardware, firmware, and/or software installed to run on hardware. The NE 600 may be any device that transports frames through a network, e.g., a switch, router, bridge, server, etc. As shown in FIG. 6, the NE 600 may comprise transceivers (Tx/Rx) 610, which may be transmitters, a receiver, or combinations thereof. A Tx/Rx 610 may be coupled to plurality of downstream ports 620 for transmitting and/or receiving frames from other nodes, a Tx/Rx 610 coupled to plurality of upstream ports 650 for transmitting and/or receiving frames from other nodes, and a processor 630 coupled to the Tx/Rxs 610 to process the frames and/or determine to which nodes to send frames. The processor 630 may comprise one or more multi-core processors and/or memory devices 632, which may function as data stores. Processor 630 may be implemented as a general processor or may be part of one or more ASICs and/or DSPs. The downstream ports 620 and/or upstream ports 650 may contain electrical and/or optical transmitting and/or receiving components. NE 600 may or may not be a routing component that makes routing decisions.

It is understood that by programming and/or loading executable instructions onto the NE 600, at least one of the processor 630, memory 632, Tx/Rx 610, are changed, transforming the NE 600 in part into a particular machine or apparatus, e.g., a multi-core forwarding architecture, having the novel functionality taught by the present disclosure. Similarly, it is understood that by programming and/or loading executable instructions onto the UE 500, at least one of the processor 520, the ROM 522, the RAM 523, secondary storage 521, display device 540, visual input 560, position sensors 550, transmitter 532, and/or receiver 512 are changed, transforming the UE 500 in part into a particular machine or apparatus, e.g., a multi-core forwarding architecture, having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an ASIC, because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 7 percent, . . . , 70 percent, 71 percent, 72 percent, . . . , 97 percent, 96 percent, 97 percent, 98 percent, 99 percent, or 100 percent. Moreover, any numerical range defined by two R numbers as defined in the above is also specifically disclosed. The use of the term "about" means ±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A user equipment (UE) comprising:
   a display;
   a visual input configured to capture motion or stop photography of a first room as visual data;
   a memory comprising instructions; and
   a processor coupled to the display, the visual input, and the memory and configured to execute the instructions by:
      receiving the visual data from the visual input, wherein the visual data comprises images of features inside of the first room, and wherein the images of the features are captured from inside of the first room;
      overlaying a graphical item on the visual data;
      causing the visual data with the graphical item to be displayed on the display;
      receiving user input indicating when the features of the first room are aligned with the graphical item;
      determining positions of the features relative to the UE upon receiving the user input indicating when each feature of the first room is aligned with the graphical item; and
      employing the determined positions of the features inside of the first room to generate a model of the first room.

2. The UE of claim 1, wherein determining the positions of the features comprises determining a distance between the UE and one of the features based on a height of the UE above a lower surface of the first room and an angle α, and wherein the angle α is an angle between a first line extending from the UE to the one feature and a second line extending between the UE and the one feature in a lateral plane.

3. The UE of claim 2, further comprising an input device, wherein the height is received from a user as user input via the input device.

4. The UE of claim 2, further comprising a position sensor coupled to the processor, wherein the height of the UE is determined based on data from the position sensor.

5. The UE of claim 2, further comprising a position sensor coupled to the processor, wherein the position sensor is configured to transmit field of view data to the processor, and wherein the processor is further configured to execute the instructions by determining the angle α based on the field of view data.

6. The UE of claim 5, wherein the position sensor comprises a gyroscope or an accelerometer, and wherein the field of view data comprises an angle of a vertical facing of the UE measured by the gyroscope or the accelerometer at a specified time.

7. The UE of claim 5, further comprising an input device coupled to the processor and configured to receive the user input from a user, wherein the processor is further configured to execute the instructions by determining the angle α based on the field of view data received when the user input indicates the one feature is aligned with the graphical item.

8. The UE of claim 1, wherein a position of each feature is further determined based on a geographical facing of the UE at a specified time.

9. The UE of claim 8, further comprising a magnetometer coupled to the processor, wherein the geographical facing of the UE is determined based on data from the magnetometer.

10. The UE of claim 1, wherein the processor is further configured to execute the instructions by:
   generating a model of a second room by determining positions of features inside of the second room relative to the UE upon receiving user input indicating when each feature of the second room is aligned with the graphical item; and
   generating a model of a building comprising the model of the first room and the model of the second room.

11. The UE of claim 10, wherein the model of the building is generated by spatially connecting the model of the first room and the model of the second room.

12. The UE of claim 11, further comprising position sensors coupled to the processor, wherein the processor is further configured to execute the instructions by spatially connecting the model of the first room and the model of the second room based on position data received from the position sensors.

13. The UE of claim 12, wherein the position sensors comprise a global positioning system (GPS) sensor, and wherein the model of the first room and the model of the second room are spatially connected based on a global position of each room indicated by the GPS sensor.

14. The UE of claim 11, wherein the processor is further configured to execute the instructions by spatially connecting the model of the first room and the model of the second room based on user input.

15. A method implemented in a user equipment (UE), the method comprising:
receiving, from a visual input of the UE, visual data comprising images of features inside of a room, wherein the images of the features are captured from inside of the room;
overlaying, by a processor of the UE, a graphical item on the visual data;
displaying, by a display of the UE, the visual data with the graphical item;
receiving, via a user input device of the UE, user input indicating when the features of the room are aligned with the graphical item;
determining, by the processor, positions of the features of the room relative to the UE upon receiving the user input indicating when each feature of the room is aligned with the graphical item; and
employing, by the processor, the determined positions of the features inside of the room to generate a model of the room.

16. The method of claim 15, further comprising:
receiving data indicating a height of the UE relative to a floor of the room; and
determining a scale of the model based on the height of the UE relative to the floor of the room.

17. The method of claim 16, wherein determining the positions of the features comprises determining a distance between the UE and the feature based on the height of the UE above the floor of the room and an angle $\alpha$, and wherein the angle $\alpha$ is an angle between a first line extending from the UE to the feature and a second line extending between the UE and the feature in a lateral plane.

18. The method of claim 17, wherein a position of each feature is further determined based on a geographical facing of the UE at a specified time.

19. The method of claim 15, wherein a position of each feature is further determined based on a vertical facing of the UE at a specified time.

* * * * *